(12) United States Patent
Kawamura

(10) Patent No.: US 8,441,805 B2
(45) Date of Patent: May 14, 2013

(54) CIRCUIT BOARD MOUNTING STRUCTURE OF COMPOUND CIRCUIT

(75) Inventor: Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 476 days.

(21) Appl. No.: 12/640,114

(22) Filed: Dec. 17, 2009

(65) Prior Publication Data

US 2010/0202124 A1 Aug. 12, 2010

(30) Foreign Application Priority Data

Feb. 9, 2009 (JP) ................................. 2009-027813

(51) Int. Cl.
*H01R 9/00* (2006.01)

(52) U.S. Cl.
USPC ............ 361/774; 361/775; 361/777; 361/813

(58) Field of Classification Search .......... 361/770–790, 361/807–810
See application file for complete search history.

(56) References Cited

U.S. PATENT DOCUMENTS

| | | | |
|---|---|---|---|
| 5,444,297 A * | 8/1995 | Oshima et al. ................ | 257/691 |
| 6,552,912 B1 * | 4/2003 | Kanazawa et al. ............ | 361/752 |
| 6,700,795 B1 * | 3/2004 | Jones et al. ................... | 361/784 |
| 8,169,784 B2 * | 5/2012 | Sakamoto et al. ............ | 361/729 |

FOREIGN PATENT DOCUMENTS

| | | |
|---|---|---|
| JP | 2005-257865 A | 9/2005 |
| JP | 2006-009687 A | 1/2006 |
| JP | 2008-42100 A | 2/2008 |

OTHER PUBLICATIONS

Japanese Office Action dated Oct. 23, 2012 issued by the Japanese Patent Office in counterpart Japanese Patent Application No. 2009-027813.

* cited by examiner

*Primary Examiner* — Tuan T Dinh
(74) *Attorney, Agent, or Firm* — Sughrue Mion, PLLC

(57) ABSTRACT

A structure for mounting a compound circuit on a circuit board is provided. The compound circuit includes a high voltage circuit and a low voltage circuit whose supply voltages are different from each other. The structure includes: a main circuit board on which constituents of the low voltage circuit are mounted; and a hybrid IC which includes a sub circuit board on which at least a part of constituents of the high voltage circuit is mounted and a moisture preventing agent coating the sub circuit board, and is arranged over the main circuit board. Both an insulation distance between terminals provided on the main circuit board for connecting to the hybrid IC and an insulation distance between terminals provided on the hybrid IC for connecting to the main circuit board are larger than a minimum insulation distance between terminals provided on the constituents mounted on the sub circuit board.

8 Claims, 4 Drawing Sheets

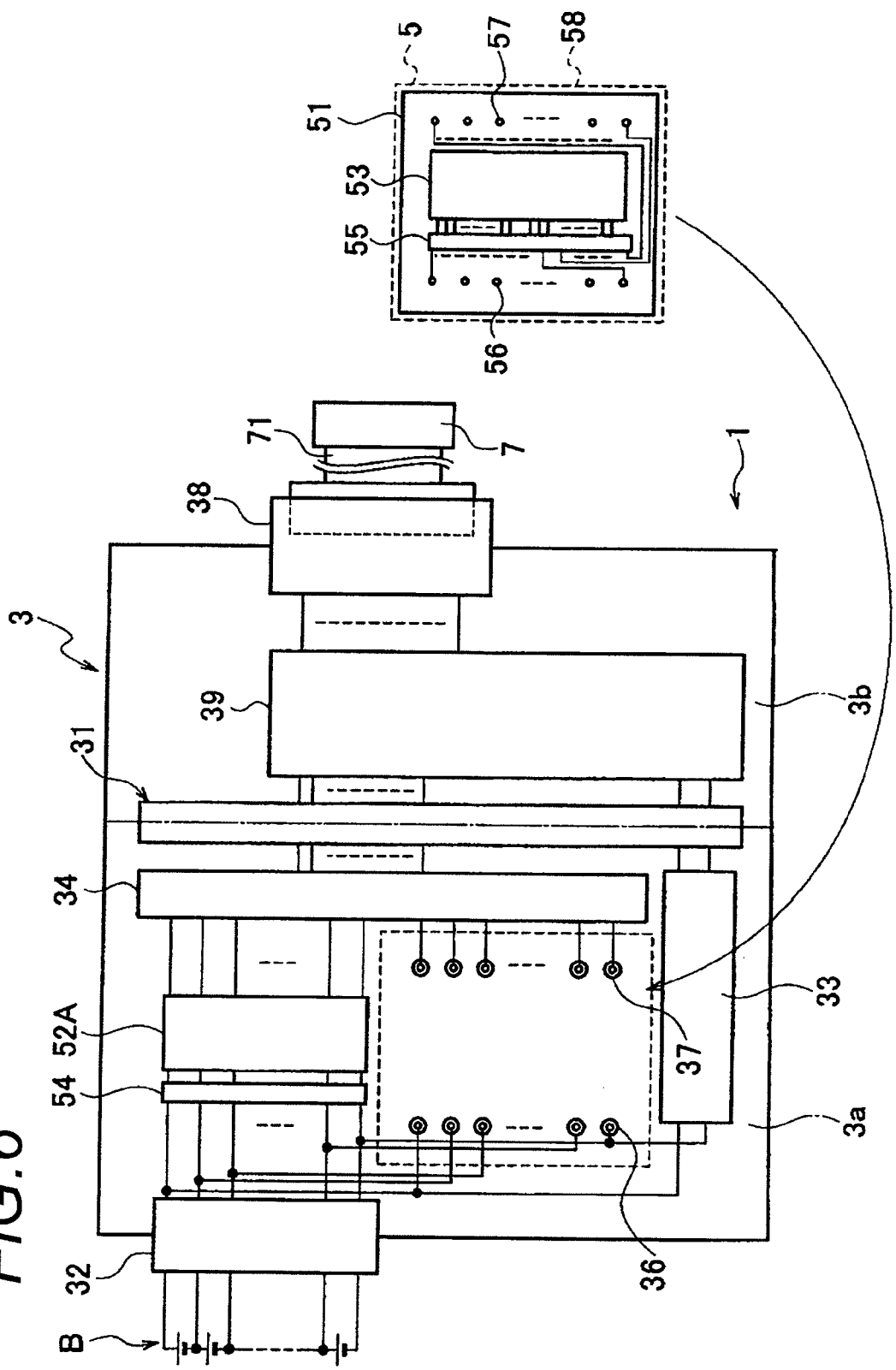

CIRCUIT BOARD MOUNTING STRUCTURE OF COMPOUND CIRCUIT

BACKGROUND OF THE INVENTION

1. Technical Field

The present invention relates to a structure for mounting a compound circuit to a circuit board, the compound circuit including a high voltage circuit and a low voltage circuit whose supply voltages are different from each other.

2. Background Art

In a case where a compound circuit including a high voltage circuit and a low voltage circuit whose supply voltages are different from each other is mounted on circuit board, it has heretofore been proposed to mount the high voltage circuit and the low voltage circuit on separate circuit boards and to arrange the circuit boards by stacking them as layers, for the purpose of suppressing the increase of the arrangement area (refer to, for example, JP-A-2005-257865 and JP-A-2006-9687).

As an example of the field in which the compound circuit including the high voltage circuit and the low voltage circuit is used as stated above, there is mentioned an electric vehicle (EV) or a hybrid vehicle (HEV being a vehicle which conjointly uses an engine and a motor-generator). In such a vehicle, the low voltage circuit which operates with the same voltage (for example, an effective voltage of 12 V) as that of a conventional vehicle employing the engine as a power source is disposed in relation to a control system and electric accessories within the vehicle. Besides, the high voltage circuit which operates with a voltage (for example, an effective voltage of 200 V) higher than that of the low voltage circuit is disposed in relation to a motor (or the motor-generator) being a power source and the peripheral equipment thereof.

In the compound circuit of the electric vehicle or the hybrid vehicle as stated above, a countermeasure for preventing any abnormal discharge due to shorting becomes especially important in the designs of the circuit and the circuit board. This is ascribable to the fact that a battery which is installed on the vehicle shifts from a lead storage battery to a lithium ion battery of higher voltage. More specifically, in the lithium ion battery, the damage of a battery function attributed to the abnormal discharge is heavier than in the lead storage battery, and the heat generations of the lithium ion battery itself and the wiring lines thereof during the abnormal discharge are more than in the case of the lead storage battery.

Besides, even in fields other than the vehicles, in the designs of the circuit and the circuit board, attention needs to be paid to the prevention of shorting in the case where the compound circuit including the high voltage circuit and the low voltage circuit is mounted on the circuit board, more than in a case where the low voltage circuit is singly mounted on the circuit board. This is important irrespective of whether or not the lithium ion battery suffering from the serious damage during the shorting is employed as a power source. Especially in the field of a commodity which is used in an environment liable to dew condensation, the prevention of the occurrence of shorting due to a waterdrop ascribable to the dew condensation must be sufficiently cared about.

In this regard, the background-art documents mentioned above, merely suggest a measure in design as suppresses the arrangement area of the circuit board, and they indicate nothing about a countermeasure against the shorting as stated above.

SUMMARY OF THE INVENTION

The present invention has been made in view of the circumstances, and an object of the invention is to provide a structure for mounting a compound circuit to a circuit board, the compound circuit including a high voltage circuit and a low voltage circuit as is useful for attaining the compatibility of the suppression of the increase of an arrangement area and the prevention of the occurrence of shorting.

In order to achieve the object, the present invention provides a structure for mounting a compound circuit on a circuit board, the compound circuit including a high voltage circuit and a low voltage circuit whose supply voltages are different from each other, the structure including: a main circuit board on which constituents of the low voltage circuit are mounted; and a hybrid IC which includes a sub circuit board on which at least a part of constituents of the high voltage circuit is mounted and a moisture preventing agent coating the sub circuit board, and is arranged over the main circuit board, wherein both an insulation distance between terminals provided on the main circuit board for connecting to the hybrid IC and an insulation distance between terminals provided on the hybrid IC and projecting from a surface of the moisture-preventing agent for connecting to the main circuit board are larger than a minimum insulation distance between terminals provided on the constituents mounted on the sub circuit board.

According to the structure for mounting the compound circuit on the circuit board according to the present invention, with the enlargement of the arrangement area of a circuit board suppressed, the prevention of the occurrence of shorting in the compound circuit can be properly attained.

BRIEF DESCRIPTION OF THE DRAWINGS

FIG. 6 is a plan view, partly exploded, of a compound circuit according to still another embodiment of the present invention.

DETAILED DESCRIPTION OF THE PREFERRED EMBODIMENTS

Figure 1:
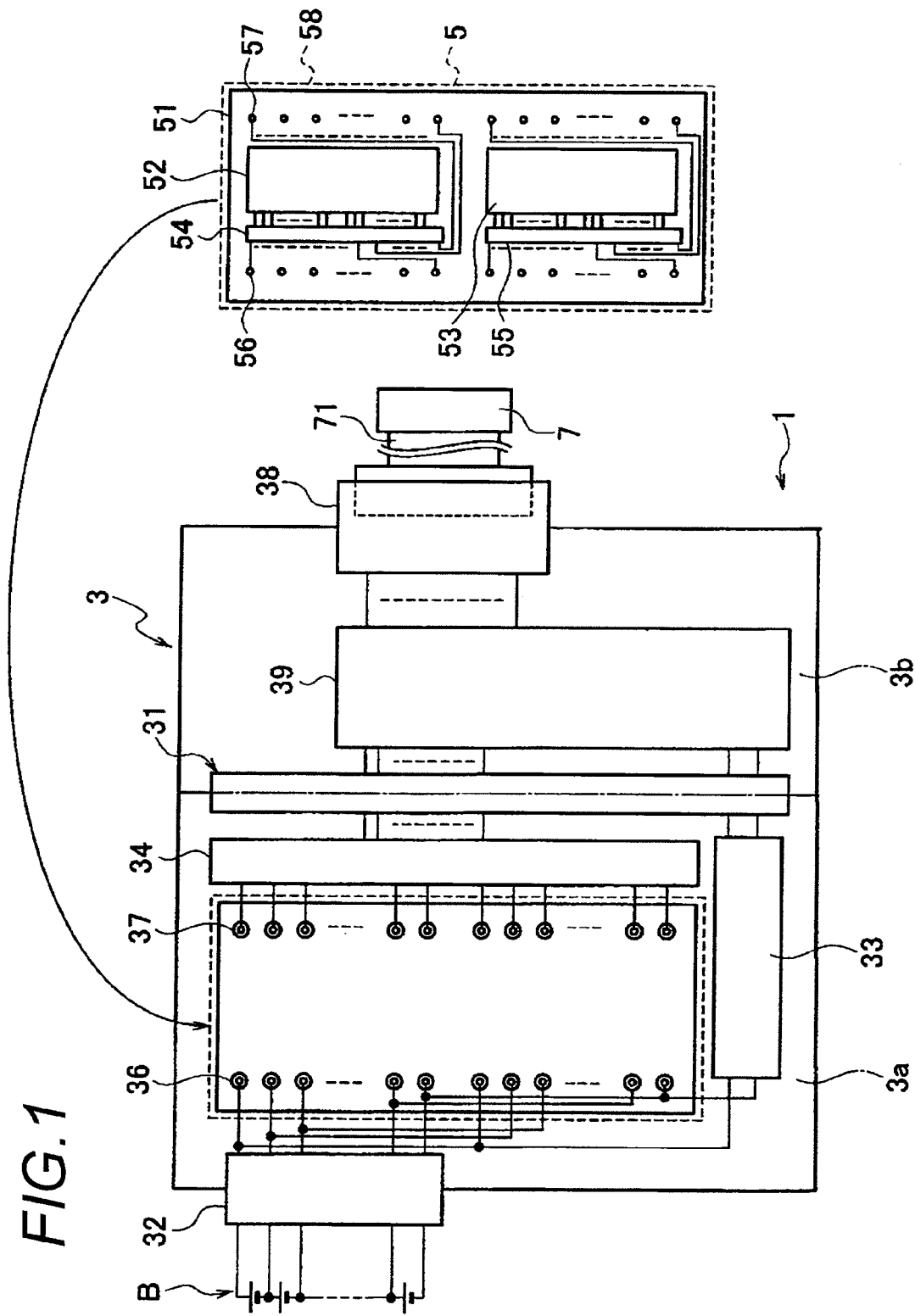
FIG. 1 is a plan view, partly exploded, of a compound circuit according to an embodiment of the present invention.

According to a first aspect of the present invention, there is provided a structure for mounting a compound circuit on a circuit board, the compound circuit including a high voltage circuit and a low voltage circuit whose supply voltages are different from each other, the structure including: a main circuit board on which constituents of the low voltage circuit are mounted; and a hybrid IC which includes a sub circuit board on which at least a part of constituents of the high voltage circuit is mounted and a moisture preventing agent coating the sub circuit board, and is arranged over the main circuit board, wherein both an insulation distance between terminals provided on the main circuit board for connecting to the hybrid IC and an insulation distance between terminals provided on the hybrid IC and projecting from a surface of the moisture-preventing agent for connecting to the main circuit board are larger than a minimum insulation distance between terminals provided on the constituents mounted on the sub circuit board.

The insulation distances between the individual terminals of the constituents of the compound circuit, especially the insulation distances between the individual terminals of the constituents of the high voltage circuit of high supply voltage need, in principle, to be set at dimensions being wide to the extent that the shorting between the adjacent terminals attributed to the adhesion of dew condensation water or the contact of a conductor does not occur. Therefore, a corresponding mounting area is required for a circuit board on which the compound circuit is mounted. Accordingly, a corresponding size is also required as the area of a place where the circuit board is arranged.

In this regard, according to the structure for mounting the compound circuit on the circuit board of the first aspect, at least some constituents of the high voltage circuit are mounted on the sub circuit board, and the sub circuit board is arranged over the main circuit board on which the low voltage circuit is mounted. Therefore, the area which is required for arranging the circuit board of the compound circuit does not become larger than in case of mounting all the constituents of the compound circuit on the main circuit board.

In addition, according to the structure for mounting the compound circuit on the circuit board of the first aspect, the insulation distances between the individual terminals of the main circuit board can be widened without enlarging the area of the main circuit board more than in the case of mounting all the constituents of the compound circuit on the main circuit board, in correspondence with the fact that the constituents which are mounted on the sub circuit board are not mounted on the main circuit board.

Accordingly, as regards connecting terminals exposed to outside, such as the connecting terminals of the hybrid IC to the main circuit board and connecting terminals existent on the main circuit board to the hybrid IC, the inter-terminal insulation distances are sufficiently secured, whereby the shorting between the adjacent terminals attributed to the adhesion of the dew condensation water or the touch of the conductor can be prevented by the large inter-terminal insulation distances.

Besides, the individual constituents on the sub circuit board are coated with the moisture preventing agent together with this sub circuit board, thereby to form the hybrid IC. Therefore, even when the inter-terminal insulation distances are shortened as to at least part of the high voltage circuit which is configured of the individual constituents mounted on the sub circuit board, the occurrence of the shorting between the adjacent terminals attributed to the adhesion of the dew condensation water or the touch of the conductor need not be apprehended.

Owing to the above, with the enlargement of the arrangement area of the circuit board suppressed, the prevention of the occurrence of the shorting in the compound circuit can be properly attained.

Moreover, since the moisture preventing agent which is used for a countermeasure for preventing the shorting due to the dew condensation of the compound circuit can be sharply decreased, the first aspect of the present invention can contribute to a countermeasure for decreasing a VOC (volatile organic compound) as has been vigorously forwarded in recent years.

In the structure according to a second aspect of the present invention, the main circuit board includes terminals for connecting the compound circuit to an external element, and an insulation distance between the terminals provided on the main circuit board for connecting to the external element is larger than the minimum insulation distance.

According to the structure for mounting the compound circuit on the circuit board of the second aspect, in a case where the connecting terminals between the compound circuit and the external elements thereof are all disposed on the main circuit board, in the structure for mounting the compound circuit on the circuit board of the first aspect in the present invention, the inter-terminal insulation distances are sufficiently secured as to the connecting terminals of the main circuit board for the external elements as are exposed to outside.

Therefore, likewise to the connecting terminals of the main circuit board for the hybrid IC, also the connecting terminals of the main circuit board for the external elements can be brought into the configuration in which the shorting between the adjacent terminals attributed to the adhesion of the dew condensation water or the touch of the conductor can be prevented by the large insulation distance between the terminals, without enlarging the area of the main circuit board.

In the structure according to a third aspect of the present invention, the hybrid IC includes a backup circuit which backs up a function of a main circuit in the high voltage circuit.

According to the structure for mounting the compound circuit on the circuit board of the third aspect, those terminal portions of the backup circuit which are coated with the moisture preventing agent, thereby to form the hybrid IC, become a state where the adhesion of the dew condensation water or the touch of the conductor is physically impossible.

Therefore, the fault of the backup circuit attributed to the occurrence of the shorting in the backup circuit can be prevented at a higher reliability than in case of mounting the backup circuit on the main circuit board. Thus, at the occurrence of a situation where the function of the main circuit must be backed up by the backup circuit, this backup circuit can be kept functioning reliably.

In the structure according to a fourth aspect of the present invention, the hybrid IC includes the main circuit.

According to the structure for mounting the compound circuit on the circuit board of the fourth aspect, also those terminal portions of the main circuit which are coated with the moisture preventing agent together with the backup circuit, thereby to form the hybrid IC, become the state where the adhesion of the dew condensation water or the contact of the conductor is physically impossible, likewise to the backup circuit.

Therefore, in the same manner as in the backup circuit, also in the main circuit, the fault of the circuit attributed to the occurrence of the shorting can be prevented at a higher reliability than in case of mounting the main circuit on the main circuit board. Thus, the main circuit can be kept functioning reliably.

In the structure according to a fifth aspect of the present invention, the hybrid IC is arranged over a part of the main circuit board excluding a mounting part of the low voltage circuit.

According to the structure for mounting the compound circuit on the circuit board of the fifth aspect, when part of the high voltage circuit is mounted on the main circuit board, the hybrid IC is arranged over the main circuit board portion on which the partial high-voltage circuit is mounted. Accordingly, even when a physical stress acts from outside on that circuit board portion of the compound circuit on which the high voltage circuit is mounted, the physical stress directly acts on only either of the high-voltage-circuit mounting portion of the main circuit board and the hybrid IC.

Therefore, in the case where the external physical stress acts on the high-voltage-circuit mounting portion, either of the main circuit of the main circuit board and the backup circuit of the hybrid IC can be protected from the direct physical stress and kept functioning even thereafter. With, for example, the configuration in which the main circuit is mounted on the main circuit board and in which the backup circuit is included in the hybrid IC, there can be obtained a structure in which, even when the compound circuit has suffered from a damage due to the external physical stress, either of the main circuit and the backup circuit functions at a higher probability continually.

Besides, the individual constituents of the compound circuit other than the low voltage circuit as are mounted on that part of the main circuit board over which the hybrid IC is arranged are shielded from external noise by the hybrid IC in addition to the main circuit board. On the other hand, the main circuit board functions as the shield member of the external noise, for the individual constituents mounted on the sub circuit board of the hybrid IC.

Accordingly, regarding the constituents of the high voltage circuit mounted on the main circuit board, the high voltage circuit being especially susceptible to the evil influence of the external noise in the compound circuit, the external noise from a direction other than that of the mounting circuit board as has heretofore been incapable of shielding can be further shielded. Also, regarding the constituents which are mounted on the sub circuit board and turned into the hybrid IC, the degree of shielding of external noise from the side of the main circuit board can be heightened. Thus, it is possible to attain the suppression of increase in the arrangement area of the circuit board and the prevention of the occurrence of shorting in the compound circuit, and simultaneously the enhancement of the noise immunity of the high voltage circuit.

Moreover, in a case where the individual constituents of the compound circuit other than the low voltage circuit as are mounted on that part of the main circuit board over which the hybrid IC is arranged include another part of the high voltage circuit except the constituents mounted on the hybrid IC, the conductive portions (connecting terminals, wiring patterns, etc.) of the high voltage circuit as are exposed to outside on the main circuit board are covered with the hybrid IC. Therefore, it is suppressed that an operator will touch the exposed conductive portion of the high voltage circuit and receive an electric shock of high voltage, and a safety against the electric shock can be heightened.

In the structure according to a sixth aspect of the present invention, the constituents mounted on the main circuit board includes a heat generating component in the vicinity of the terminals provided on the main circuit board for connecting to the hybrid IC, and the terminals provided on the main circuit board for connecting to the hybrid IC have a heat radiating function.

According to the structure for mounting the compound circuit on the circuit board of the sixth aspect, heat generated in the heat generating component on the main circuit board is conducted to the connecting terminals of the hybrid IC as exist in the vicinity of the heat generating component. In addition, the heat conducted from the heat generating component is emitted from the connecting terminals of the hybrid IC as have a heat radiating function, into the surrounding atmosphere thereof.

Accordingly, the connecting terminals of the hybrid IC are utilized as the heat radiator of the heat generated by the heat generating component, whereby the inferior operation, etc. of the compound circuit attributed to the heat can be prevented from occurring. With a configuration in which the heat generating component and the connecting terminals of the hybrid IC are electrically connected by the conductive patterns or the likes on the main circuit board, the heat is efficiently conducted from the heat generating component to the connecting terminals of the hybrid IC by using the conductive patterns or the likes as heat conduction media, and it can be efficiently emitted from the connecting terminals of the hybrid IC.

Embodiment

Now, embodiments of a structure for mounting a compound circuit on a circuit board according to the present invention will be described with reference to the drawings.

Figure 2:
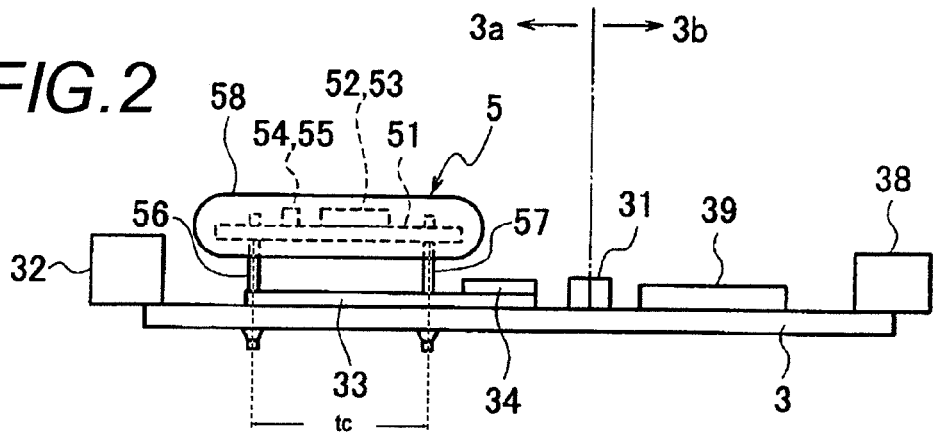
FIG. 2 is a side view of the compound circuit shown in FIG. 1.
Figure 3:
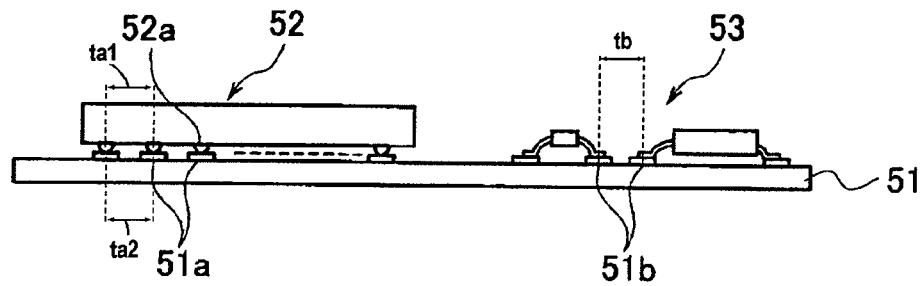
FIG. 3 is a side view of a hybrid IC shown in FIG. 1.

FIG. 1 is a partly exploded plan view of a compound circuit according to one embodiment of the present invention, FIG. 2 is a side view of the compound circuit shown in FIG. 1, and FIG. 3 is a side view of a hybrid IC shown in FIG. 1.

The compound circuit 1 of this embodiment in FIG. 1 is disposed in a discharge control apparatus which controls discharge for the load (not shown) of a lithium ion battery B (corresponding to an external element) including a plurality of cells. The compound circuit 1 includes a main circuit board 3 and a hybrid IC 5.

The main circuit board 3 is provided with a high-voltage-circuit mounting area 3a and a low-voltage-circuit mounting area 3b for mounting a high voltage circuit and a low voltage circuit of different supply voltages, respectively. Besides, a non-contact signal transmission coupler (hereinbelow, abbreviated to the "non-contact coupler") 31 is mounted on the boundary part between both the areas 3a and 3b. The non-contact coupler 31 transmits a signal in non-contact fashion between an element mounted on the high-voltage-circuit mounting area 3a and an element mounted on the low-voltage-circuit mounting area 3b. As the non-contact coupler 31, it is possible to utilize a known one of, for example, optical coupling scheme or electromagnetic coupling scheme.

On the high-voltage-circuit mounting area 3a, there are mounted an input connector 32 which serves to be connected to the individual cells of the lithium ion battery B, a high-voltage total voltage processing circuit 33 which is connected to the input connector 32, and an interface and high-voltage-side control circuit (hereinbelow, abbreviated to the "high-voltage-side control circuit") 34 to which the hybrid IC 5 is connected. The high-voltage total voltage processing circuit 33 and the high-voltage-side control circuit 34 are connected to the high-voltage-circuit side of the non-contact coupler 31. The high-voltage total voltage processing circuit 33 is a circuit by which a signal at a level corresponding to the total voltage of all the cells accepted from the lithium ion battery B through the input connector 32 is outputted to the non-contact coupler 31. The high-voltage-side control circuit 34 receives the output signal of the hybrid IC 5 and outputs the received signal to the non-contact coupler 31.

The hybrid IC 5 is arranged over the high-voltage-circuit mounting area 3a of the main circuit board 3. The hybrid IC 5 includes a sub circuit board 51, a main IC chip 52 which is mounted on the sub circuit board 51, a backup circuit 53, respective interface circuits 54 and 55 for the main IC chip 52 and the backup circuit 53, and input-side and output-side connecting pins 56 and 57 which are respectively connected to each of the interface circuits 54 and 55 by conductive patterns (not shown) on the sub circuit board 51.

Each of the main IC chip 52 and the backup circuit 53 serves to monitor the voltages of the individual cells of the lithium ion battery B whose potential changes with charge and discharge. The backup circuit 53 is constituted by discrete components. The backup circuit 53 functions instead of the main IC chip 52 in a case where any fault has occurred in this main IC chip 52.

In the hybrid IC 5 stated above, the individual leads (terminals) 52a of the main IC chip 52 shown in FIG. 3 are soldered to lands (terminals) 51a on the sub circuit board 51 by, for example, a reflow treatment. The other constituents of the hybrid IC 5 except the main IC chip 52 are soldered to terminals on the corresponding conductive patterns of the sub circuit board 51 by, for example, a flow treatment. In FIG. 3, among terminals on the sub circuit board 51, only terminals 51b to which the individual constituents of the backup circuit 53 are soldered are representatively illustrated. Moreover, the parts of the connecting pins 56 and 57 of the input side and the output side, except the distal ends thereof, are all coated with a moisture preventing agent 58, whereby the hybrid IC 5 is formed. That is, the distal ends of the connecting pins 56 and 57 are projected from a surface of the moisture preventing agent 58. A known material can be employed as the moisture preventing agent 58.

In addition, the pitch ta1 between those adjacent leads 52a of the main IC chip 52 which are coated with the moisture preventing agent 58, the pitch ta2 between the corresponding adjacent lands 51a of the sub circuit board 51, the pitch tb between those terminals 51b on the sub circuit board 51 which correspond to the individual constituents of the backup circuit 53, and the pitches between those unshown terminals on the sub circuit board 51 which correspond to the individual interface circuits 54 and 55, are all set at equal small dimensions.

In contrast, the pitches tc between the adjacent terminals of the connecting pins 56 and 57 of the input side and the output side as are exposed outside the moisture preventing agent 58 are set dimensions larger than the pitch ta1 between those adjacent leads 52a of the main IC chip 52 which are coated with the moisture preventing agent 58, the pitch ta2 between the corresponding adjacent lands 51a of the sub circuit board 51, the pitch tb between the terminals 51b on the sub circuit board 51 as correspond to the individual constituents of the backup circuit 53, and the pitches between the unshown terminals on the sub circuit board 51 as correspond to the individual interface circuits 54 and 55.

The pitches tc between the terminals of the individual connecting pins 56 and 57 should desirably be such that, even when a waterdrop ascribable to dew condensation appears to adhere to the pins or to come into contact with a surrounding conductor, the adjacent connecting pins 56 and 57 do not short due to the adhesion of the waterdrop or the touch thereof with the conductor.

The individual connecting pins 56 and 57 of the input side and the output side as stated above are soldered to the hybrid-IC connecting terminals 36 and 37 in FIG. 1 as are disposed in the high-voltage-circuit mounting area 3a of the main circuit board 3, by the flow treatment by way of example. The individual hybrid-IC connecting terminals 36 to which the individual connecting pins 56 of the input side are soldered are connected to the individual cells of the lithium ion battery B through the input connector 32. The individual hybrid-IC connecting terminals 37 to which the individual connecting pins 57 of the output side are soldered are connected to the interface of the high-voltage-side control circuit 34.

The pitches between the adjacent terminals of the hybrid-IC connecting terminals 36 and 37 disposed in the high-voltage-circuit mounting area 3a of the main circuit board 3 correspond to the pitches tc between the terminals of the individual connecting pins 56 and 57 of the hybrid IC 5. Accordingly, the pitches between the adjacent terminals of the hybrid-IC connecting terminals 36 and 37 are set at dimensions larger than those of the pitch ta1 between the adjacent leads 52a of the main IC chip 52 and the individual pitches ta2, tb between the adjacent lands 51a and terminals 51b of the sub circuit board 51.

On the low-voltage-circuit mounting area 3b, there are mounted, for example, an output connector 38 which serves to connect a harness 71 from an ECU ("Electronic Control Unit" corresponding to an external element) 7 installed on a vehicle (not shown), and a low-voltage-side control circuit 39 which is connected to the output connector 38. The low-voltage-side control circuit 39 accepts the individual outputs of the high-voltage total voltage processing circuit 33 and the high-voltage-side control circuit 34 through the non-contact coupler 31, and subjects the received outputs to necessary processing. Thereafter, this control circuit 39 outputs a signal which indicates the result of the monitoring of the voltage of the lithium ion battery B, to the ECU 7 through the output connector 38 and the harness 71 with a low voltage.

In the compound circuit 1 of this embodiment thus configured, the voltages of the individual cells of the lithium ion battery B are monitored in the main IC chip 52 and the backup circuit 53 of the hybrid IC 5, and signals which indicate the potentials of the individual cells obtained by the voltage monitoring are inputted to the high-voltage-side control circuit 34 of the main circuit board 3. In addition, the existence or nonexistence of any fault in the main IC chip 52 is determined in the high-voltage-side control circuit 34 on the basis of the level of the signal inputted from the main IC chip 52. In case of the determination that the fault does not exist in the main IC chip 52, the input signal from the main IC chip 52 is selectively outputted from the high-voltage-side control circuit 34 to the non-contact coupler 31. On the other hand, in case of the determination that the fault exists in the main IC chip 52, the input signal from the backup circuit 53 is selectively outputted from the high-voltage-side control circuit 34 to the non-contact coupler 31.

Besides, in the compound circuit 1 of this embodiment, the signal of a level corresponding to the total voltage of all the cells of the lithium ion battery B is generated in the high-voltage total voltage processing circuit 33, and this signal is outputted to the non-contact coupler 31.

In the non-contact coupler 31, the voltage level of the output signal from the high-voltage total voltage processing circuit 33 or the high-voltage-side control circuit 34 is converted from a high voltage to a low voltage by a non-contact transmission scheme such as the optical coupling scheme or the electromagnetic coupling scheme, and the low voltage is outputted to the low-voltage-side control circuit 39. In the low-voltage-side control circuit 39, the total voltage of all the cells of the lithium ion battery B which is indicated by the output signal from the high-voltage total voltage processing circuit 33 as has been turned into the low voltage in the non-contact coupler 31 is compared with a predetermined threshold value. Besides, in the low-voltage-side control circuit 39, the voltage each individual cell of the lithium ion battery B which is indicated by the output signal from the high-voltage-side control circuit 34 as has been turned into the low voltage in the non-contact coupler 31 is compared with a predetermined threshold value. In addition, signals which indicate the results of the respective comparisons are outputted from the low-voltage-side control circuit 39 to the ECU 7 through the output connector 38 and the harness 71.

In the compound circuit 1 of this embodiment performing the operations as stated above, the main IC chip 52 and the backup circuit 53 which form parts of the high voltage circuit are mounted on the sub circuit board 51 and are coated with the moisture preventing agent 58, thereby to configure the hybrid IC 5. Therefore, the leads 52a of the main IC chip 52 coated with the moisture preventing agent 58, the corresponding lands 51a of the sub circuit board 51, and those terminals 51b of the sub circuit board 51 to which the individual constituents of the backup circuit 53 are soldered, are protected from the adhesion of the waterdrops ascribable to the dew condensation. Accordingly, no hindrance occurs even when the adjacent lands 51a or terminals 51b and the leads 52a have their pitches made small so as to short due to the adhesion of the waterdrops ascribable to the dew condensation.

Consequently, the quantity of use of the moisture preventing agent 58 for the coating can be decreased by making the area of the sub circuit board 51 small. Even if a volatile organic compound is contained in the moisture preventing agent 58, an environmental countermeasure concerning the diffusion of the VOC can be enhanced by suppressing the quantity of the volatilization thereof into the surrounding air.

Moreover, the hybrid IC 5 is fabricated in such a way that the individual constituents of the main IC chip 52 and the backup circuit 53 on the sub circuit board 51 are coated with the moisture preventing agent 58. Therefore, it can be prevented that shorting will occur at the corresponding parts, to make the circuit faulty, at a higher probability than in case of mounting these parts on the main circuit board 3. Thus, the main IC chip 52 and the backup circuit 53 can be kept functioning reliably. Therefore, the voltage monitoring of the individual cells of the lithium ion battery B based on the main IC chip 52 and the backup circuit 53 can be continually performed at a high reliability.

On the other hand, in the high-voltage-circuit mounting area 3a of the main circuit board 3, the constituents of the high voltage circuit to be mounted lessen in correspondence with the main IC chip 52 and the backup circuit 53 which are mounted on the sub circuit board 51. Therefore, even when the area of the high-voltage-circuit mounting area 3a is not enlarged, the pitches between the adjacent ones of the hybrid IC connecting terminals 36 and 37 can be set at dimensions larger than those of the pitch between the adjacent leads 52a of the main IC chip 52 and the individual pitches between the adjacent lands 51a and terminals 51b of the sub circuit board 51. Thus, the waterdrops ascribable to the dew condensation have appeared and adhered or have touched the surrounding conductor, the adjacent connecting terminals 36 and 37 can be prevented from shorting on account of the adhesion of the waterdrops or the touch with the conductor.

Besides, according to the compound circuit 1 of this embodiment, even when a physical stress has been applied from outside to that part of the main circuit board 3 at which the high-voltage-circuit mounting area 3a and the hybrid IC 5 are arranged in overlapping fashion, the physical stress directly acts on only either of the high-voltage-circuit mounting area 3a and the hybrid IC 5 of the main circuit board 3.

Therefore, in a case where the physical stress has been applied from outside to that part of the main circuit board 3 at which the high-voltage-circuit mounting area 3a and the hybrid IC 5 are arranged in the overlapping fashion, either the high-voltage total voltage processing circuit 33 and the high-voltage-side control circuit 34 which are mounted on the high-voltage-circuit mounting area 3a of the main circuit board 3, or the main IC chip 52 and the backup circuit 53 (and the interface circuits 54 and 55 thereof) of the hybrid IC 5 can be protected from the direct physical stress and can thereafter be continued to function.

Further, according to the compound circuit 1 of this embodiment, the sub circuit board 51 of the hybrid IC 5 which is arranged over the high-voltage-circuit mounting area 3a functions as the shield plate of external noise from above the main circuit board 3, for the high-voltage total voltage processing circuit 33 and the high-voltage-side control circuit 34 which are mounted on the high-voltage-circuit mounting area 3a.

Accordingly, regarding the high-voltage total voltage processing circuit 33 and high-voltage-side control circuit 34 of that high voltage circuit of the compound circuit 1 which is especially susceptible to the adverse affect of the external noise, the circuits 33 and 34 being mounted on the main circuit board 3, external noise from a direction other than that of the mounting circuit board as has heretofore been incapable of interception can be further intercepted. Also, regarding the main IC chip 52 and the backup circuit 53 which are mounted on the sub circuit board 51 and turned into the hybrid IC 5, and the interface circuits 54 and 55 thereof, the degree of interception of external noise from the side of the main circuit board 3 can be heightened. Thus, it is possible to attain the suppression of increase in the arrangement area of the circuit board and the prevention of the occurrence of shorting in the compound circuit 1, and simultaneously the enhancement of the noise immunity of the high voltage circuit.

Modifications

Figure 4A:
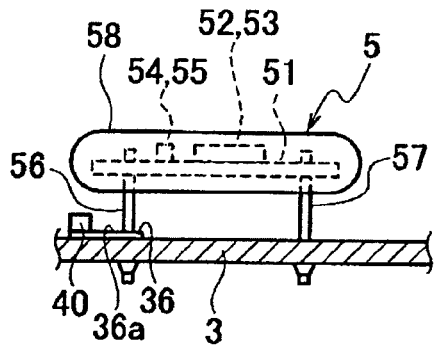
FIGS. 4A and 4B are explanatory views, partly in section, showing main portions in a compound circuit according to a modification to the embodiment of the present invention.

FIG. 4A is an explanatory view, partly in section, showing essential portions in a compound circuit according to a modification to the embodiment stated above. In the compound circuit 1 of the modification shown in FIG. 4A, a heat generating component 40 such as a resistor is mounted on the high-voltage-circuit mounting area 3a of a main circuit board 3. In addition, the heat generating component 40 is electrically connected by a conductive pattern 36a with a hybrid IC connecting terminal 36 to which the individual connecting pin 56 of a hybrid IC 5 on the input side thereof is to be soldered. The conductive pattern 36a is made of a material which is higher in thermal conductivity than the main circuit board 3.

In this modification, heat generated in the heat generating component 40 is transferred to the hybrid IC connecting terminal 36 through the conductive pattern 36a. In addition, the hybrid IC connecting terminal 36 functions as a kind of heat radiator to emit the heat transferred from the heat generating component 40, into the surrounding air from the hybrid IC connecting terminal 36. That is, the hybrid IC connecting terminal 36 has the heat radiating function.

With the configuration as in this modification, the inferior operation of the hybrid circuit 1, etc. attributed to the heat generated by the heat generating component 40 can be prevented from occurring, by utilizing the hybrid IC connecting terminal 36 (or a hybrid IC connecting terminal 37).

Figure 4B:
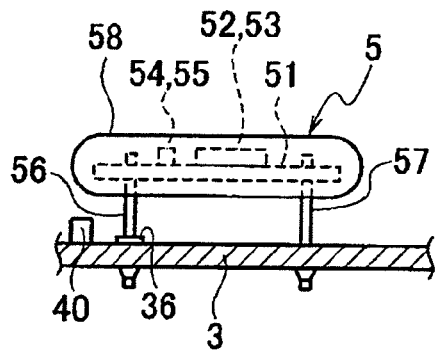

The modification shown in FIG. 4A has the configuration in which the heat generating component 40 and the hybrid IC connecting terminal 36 are electrically connected by the conductive pattern 36a. Alternatively, it is also allowed to adopt a configuration in which the heat generating component 40 and the hybrid IC connecting terminal 36 are not electrically connected as in another modification shown in FIG. 4B. Also in this case, the main circuit board 3 serves as a thermal conduction medium to transfer the heat generated in the heat generating component 40, to the hybrid IC connecting terminal 36, and it emits the heat into the surrounding atmosphere from the hybrid IC connecting terminal 36. Even with such a modification in FIG. 4B, the same advantage as that of the modification in FIG. 4A can be brought forth.

Figure 5:
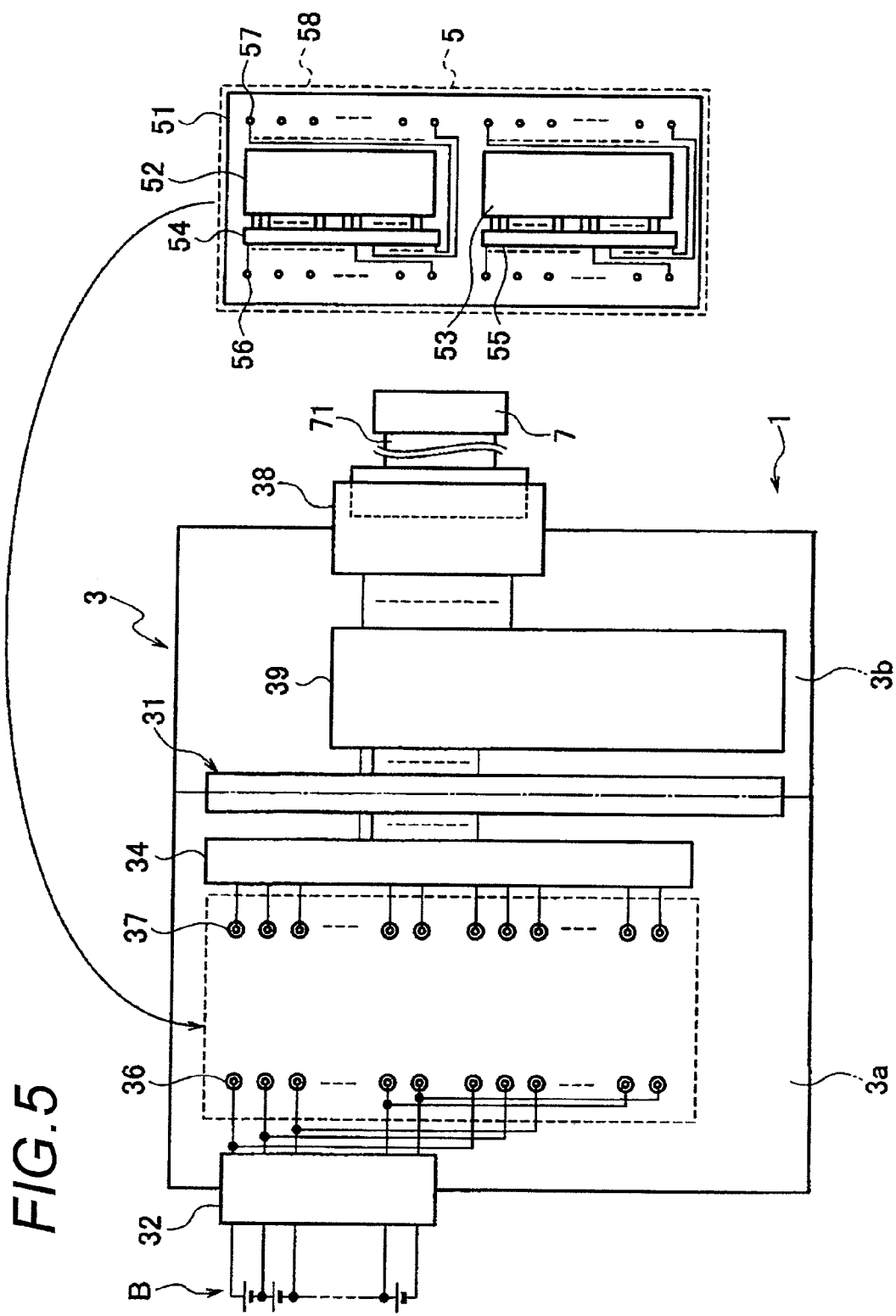
FIG. 5 is a plan view, partly exploded, of a compound circuit according to another embodiment of the present invention.

The foregoing embodiment has been described as to the case where the high-voltage total voltage processing circuit 33 is mounted on the main circuit board 3. Alternatively, it is also allowed to adopt a configuration in which the high-voltage total voltage processing circuit 33 is omitted as shown in FIG. 5, as long as the voltage monitoring of the individual cells of the lithium ion battery B based on the main IC chip 52 and the backup circuit 53 can be continually performed at a high reliability. This is because, insofar as the main IC chip 52 and the backup circuit 53 are functioning normally, the total voltage of all the cells of the lithium ion battery B can be calculated from the voltages of the individual cells monitored by either of the chip 52 and the circuit 53.

Besides, the foregoing embodiment has been described as to the configuration in the case where the main IC chip 52 and the interface circuit 54 thereof are mounted on the sub circuit board 51 together with the backup circuit 53 and the interface circuit 55 thereof, thereby to form part of the hybrid IC 5. It is also allowed to adopt a configuration in which only the backup circuit 53 and the interface circuit 55 thereof are mounted on the sub circuit board 51, thereby to form the hybrid IC 5. In that case, the main IC chip 52 which is mounted on the high-voltage-circuit mounting area 3a of the main circuit board 3 together with the interface circuit 54 should desirably be configured of a discrete circuit which is similar to the backup circuit 53 and in which the pitch between the terminals is easily widened.

A compound circuit 1 shown in FIG. 6 consists in such a configuration. In the compound circuit 1, the circuit which is configured in the main IC chip 52 in the foregoing embodiment is altered into a main circuit 52A based on the discrete circuit. Thus, the pitches between the constituents of the main circuit 52A and terminals (not shown) on the high-voltage-circuit mounting area 3a of the main circuit board 3 as correspond to the interface circuit 54 can be set at dimensions larger than the pitch between the adjacent terminals 51b of the sub circuit board 51, likewise to the pitches between the adjacent ones of the hybrid IC connecting terminals 36 and 37.

According to the embodiment of the compound circuit 1 in FIG. 6 as configured in this way, the same advantages as those of the embodiment described with reference to FIGS. 1 through 3 can be basically obtained, except that subjects which can be protected from inter-terminal shorting by the moisture preventing agent 58 as the hybrid IC 5 are limited to the individual constituents of the backup circuit 53 (and the interface circuit 54 thereof).

In the case of such a configuration, as also shown in FIG. 6, the hybrid IC 5 need not always be set at a size which is large enough to cover the entirety of the high-voltage-circuit mounting area 3a of the main circuit board 3. Even in that case, the shielding against external noise, of that part of the high-voltage-circuit mounting area 3a over which the hybrid IC 5 is arranged, can be heightened by the existence of the hybrid IC 5.

Moreover, even in the case where the compound circuit 1 is configured as shown in FIG. 6, when a physical stress acts from outside on that part of the main circuit board 3 at which the high-voltage-circuit mounting area 3a and the hybrid IC 5 are arranged in overlapping fashion, the physical stress directly acts on only either of the high-voltage-circuit mounting area 3a and the hybrid IC 5 of the main circuit board 3.

Therefore, when the physical stress acts from outside on that part of the main circuit board 3 at which the high-voltage-circuit mounting area 3a and the hybrid IC 5 are arranged in the overlapping fashion, either of the main circuit 52A mounted on the high-voltage-circuit mounting area 3a of the main circuit board 3 and the backup circuit 53 of the hybrid IC 5 is protected from the direct physical stress. Accordingly, even after the physical stress has acted, the function of monitoring the voltages of the individual cells of the lithium ion battery B whose potential changes with charge and discharge can be kept by either the main circuit 52A or the backup circuit 53.

Besides, also the compound circuit 1 of the embodiment shown in FIG. 6 can have the configuration in which the high-voltage total voltage processing circuit 33 is omitted, likewise to the compound circuit 1 of the embodiment shown in FIG. 5.

A place over which the hybrid IC 5 is arranged is not limited to the part over the high-voltage-circuit mounting area 3a of the main circuit board 3. By way of example, the hybrid IC 5 may be arranged over both the high-voltage-circuit mounting area 3a and the low-voltage-circuit mounting area 3b, or it may well be arranged over the low-voltage-circuit mounting area 3b.

Besides, the foregoing embodiment has been described by exemplifying the compound circuit 1 which monitors the voltages of the individual cells of the lithium ion battery B, but the present invention is applicable to extensive fields as a structure in the case where a compound circuit in which a high voltage circuit of high supply voltage and a low voltage circuit of low supply voltage coexist is mounted on a circuit board.

The invention is well suited when applied in a case where a compound circuit including a high voltage circuit and a low voltage circuit whose supply voltages are different from each other, is mounted on a circuit board.

What is claimed is:

1. A structure for mounting a compound circuit on a circuit board, the compound circuit including a high voltage circuit having constituents and a low voltage circuit having constituents whose supply voltages are different from each other, the structure comprising:
    a main circuit board including a low voltage circuit mounting area and a high voltage circuit mounting area on which the constituents of the low voltage circuit and a portion of the constituents of the high voltage circuit are mounted, respectively; and
    a hybrid IC being arranged over the main circuit board and including a sub circuit board on which a remainder of the constituents of the high voltage circuit are mounted and a coating of a moisture-preventing agent which coats the sub circuit board,
    wherein both an insulation distance between terminals provided in the high voltage circuit mounting area on the main circuit board for connecting to the hybrid IC and an insulation distance between terminals provided on the hybrid IC and projecting and being exposed from a surface of the moisture-preventing agent for connecting to the high voltage circuit mounting area on the main circuit board are larger than a minimum insulation distance between terminals of the remainder of constituents of the high voltage circuit mounted on the sub circuit board which are disposed inside the coating of the moisture-preventing agent.

2. The structure according to claim 1, wherein the main circuit board includes additional terminals for connecting the compound circuit to an external element, and
    an insulation distance between the additional terminals provided on the main circuit board for connecting to the external element is larger than the minimum insulation distance.

3. The structure according to claim 1, wherein the hybrid IC includes a backup circuit which backs up a function of a main circuit in the high voltage circuit.

4. The structure according to claim 3, wherein the hybrid IC includes the main circuit.

5. The structure according to claim 1, wherein the hybrid IC is arranged over a part of the main circuit board excluding a mounting part of the low voltage circuit.

6. The structure according to claim 1, wherein the constituents mounted on the main circuit board includes a heat generating component in the vicinity of the terminals provided on the main circuit board for connecting to the hybrid IC, and the terminals provided on the main circuit board for connecting to the hybrid IC have a heat radiating function.

7. The structure according to claim 1, wherein the sub circuit board is entirely coated with the moisture-preventing agent.

8. The structure according to claim 1, wherein the remainder of the constituents of the high voltage circuit mounted on the sub circuit board are coated with the moisture-preventing agent except for an exposed distal ends of the terminals projected from the surface of the moisture-preventing agent to be connected to the high voltage circuit mounting area.

* * * * *